United States Patent [19]

Smith

[11] 4,348,598
[45] Sep. 7, 1982

[54] POWER-PULSE SWITCHING CIRCUIT

[76] Inventor: Steve Smith, 1220 S. 49th St., Richmond, Calif. 94804

[21] Appl. No.: 115,498

[22] Filed: Jan. 25, 1980

[51] Int. Cl.³ .......................... H03K 3/45; H03K 3/33
[52] U.S. Cl. .................................. 307/300; 307/254; 307/280; 307/314
[58] Field of Search ................ 307/280, 300, 314, 282

[56] References Cited

U.S. PATENT DOCUMENTS

| | | | |
|---|---|---|---|
| 3,482,109 | 12/1969 | Yii | 307/314 |
| 3,651,375 | 3/1972 | Ebersohl | 307/314 |
| 3,818,253 | 6/1974 | Chafer et al. | 307/314 |
| 4,042,844 | 8/1977 | Barthold | 307/314 |

Primary Examiner—Stanley D. Miller, Jr.
Assistant Examiner—B. P. Davis
Attorney, Agent, or Firm—Thomas E. Schatzel

[57] ABSTRACT

A switching circuit for conducting a pulse of current between a first and a second terminal, the circuit including a transistor having a base connected to the first terminal, an emitter and a collector and a saturable-core transformer having an emitter winding coupling the emitter to the first terminal and a collector winding coupling the second terminal to the collector so as to provide regenerative current feedback rapidly driving the transistor into saturation after the transistor is suitably triggered, the circuit diverting the collector current from the emitter to the base circuit sweeping carriers out of the base and hastening the transistor turn-off after the transformer core saturates decoupling the emitter and collector windings.

21 Claims, 9 Drawing Figures

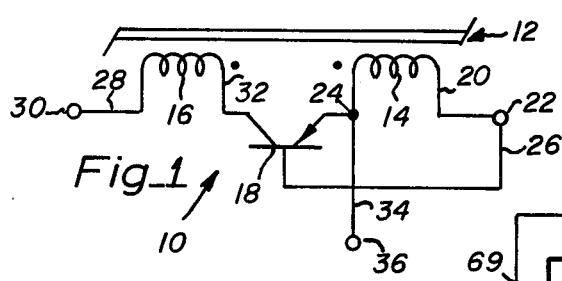
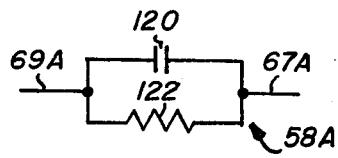
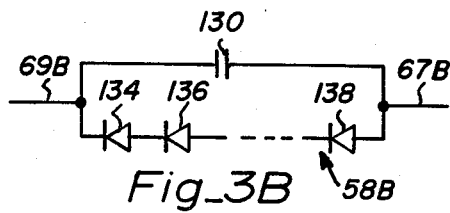
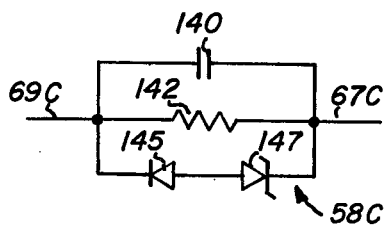
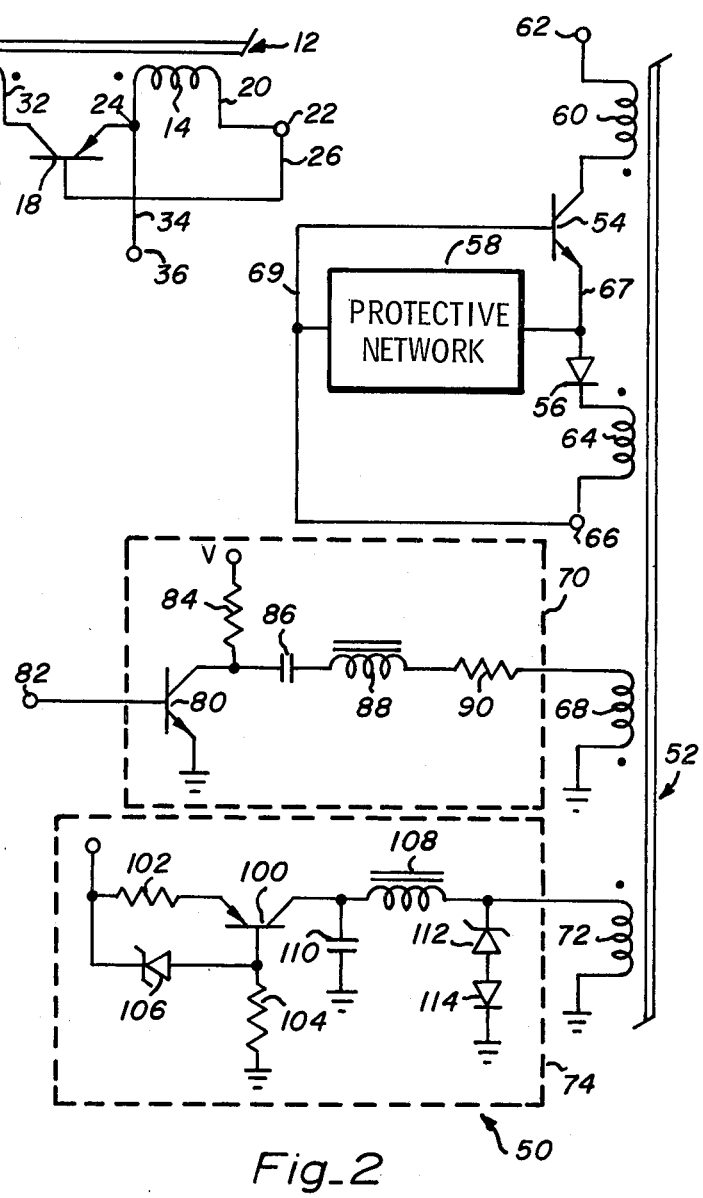
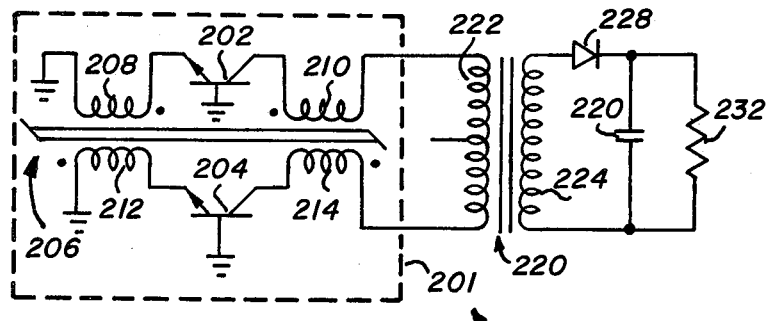

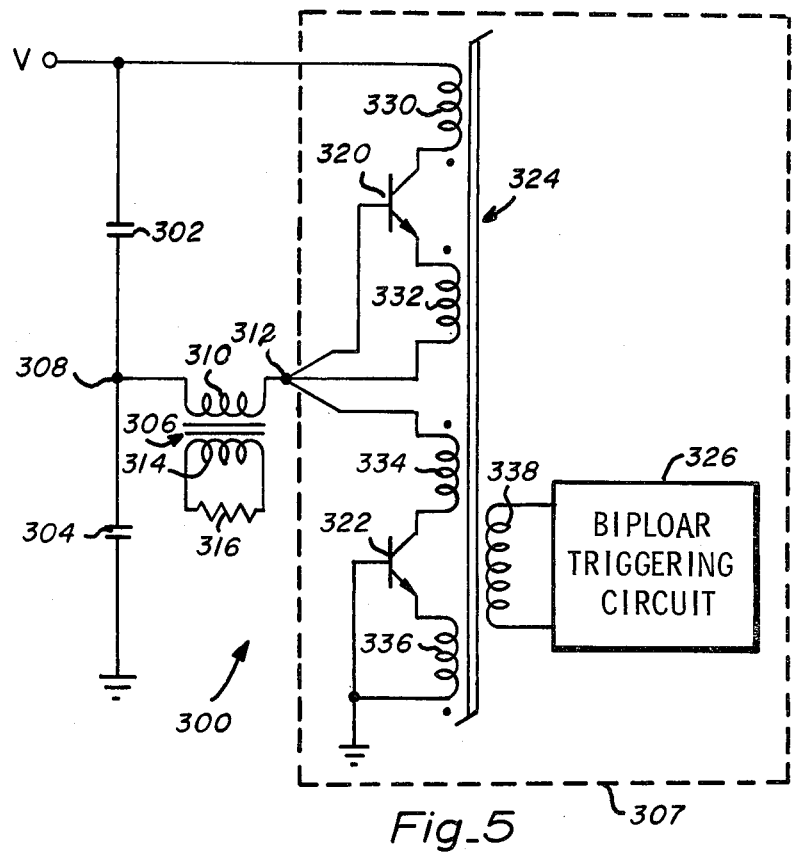
Fig_5
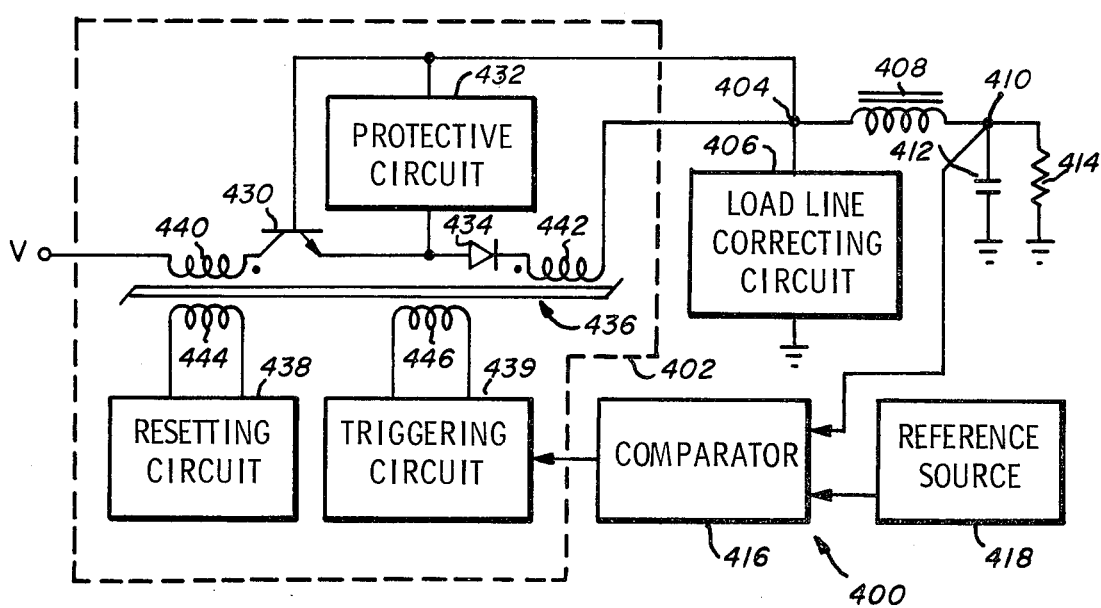
Fig_6

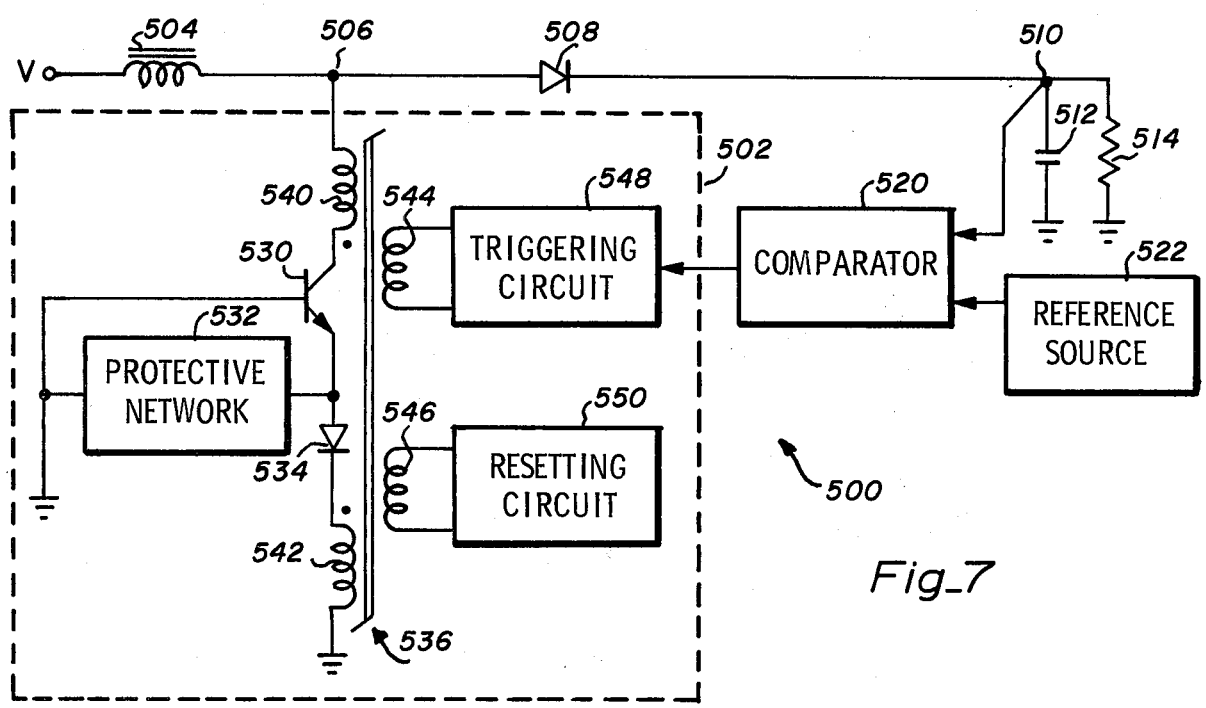
Fig_7

POWER-PULSE SWITCHING CIRCUIT

BACKGROUND OF THE INVENTION

1. Field of the Invention

The present invention relates to power processors in general, and more specifically to a power pulse switching circuit of common base configuration for use therein.

2. Description of the Prior Art

Although the switching speed of power-pulse switching circuits, circuits for conducting a relatively large current between a pair of terminals for a predetermined period of time in response to a triggering signal, is of considerable moment, the switching speed of such circuits is of particular concern when such circuits are employed in prior art power processors. Such prior art power processors include those which are known in the art as bucking regulators, boost regulators, converters and inverters.

Bucking regulators develop from a potential source a reduced-level regulated potential for use by a load. A typical bucking regulator includes a switching circuit, such as a power-pulse switching circuit, connected between the potential source and a first node and an inductive element connected between the first node and the load, the combination for selectively coupling current from the source to the load. Also included is an error amplifier having a pair of inputs connected so as to compare the potential developed across the load, or a derivative thereof, with a reference potential for developing an error signal and a generator connected between the output of the error amplifier and the switching circuit for selectively triggering the switching circuit responsive to the error signal. Finally, a filter capacitor connected across the load and a circulating diode, or a load-line-correcting circuit including a circulating diode, connected from the first node to a node common to the source and load are also included.

A load-line-correcting circuit is employed to reduce the power dissipated by the switching circuit by preventing the switching circuit from switching the full operating potential while conducting the full operating current. In other words, ideally, the load-line-correcting circuit prevents a substantial current from flowing through the switching circuit until the potential across the switching circuit has been substantially reduced when the switching circuit is turning on. Additionally, the load-line-correcting circuit substantially reduces the current flow through the switching circuit before the potential across the switching circuit has been substantially increased when the switching circuit is turning off. A number of non-dissipative load-line-correcting circuits are described in the article which is entitled "Designing Non-Dissipative Current Snubbers For Switching Mode Converters" authored by Eugene C. Whitcomb and published in the proceedings of the Sixth National Solid-State Power Conversion Conference dated May 1979 starting on page B1.

If the positions of the power pulse switching circuit, the inductive element and the diode of the bucking regulator are rearranged, the resultant configuration, called a boost regulator, is operative to develop from a potential source an increased-level regulated potential for use by the load. Specifically, the inductive element is connected between the potential source and the first node. The diode is connected between the first node and the load, and the switching circuit is connected between the first node and the common node.

Should the inductive element, which may be thought of as a one-to-one auto-transformer, of the boost regulator, be replaced by the primary winding of a transformer having a secondary winding across which the diode, capacitor and the load are connected such that the diode is in series with the parallel combination of the capacitor and the load, the power processor is known as a DC-to-DC converter. Finally, if the load is connected directly across the secondary of the transformer, the power processor is of the type which is known as a DC-to-AC inverter. For a description of various configurations of prior art power processors and an analysis of the configurations which leads to the conclusion that the various configurations are equivalent, the reader is referred to the article entitled "Unifying Derivation of Switching Regulator Topologies", authored by E. E. Landsman and published in the IEEE Power Electronics Specialists Conference Record of June 1979; the article entitled "Techniques for Designing New Types of Switching Regulators", authored by Rudy Severns and published in the European Power Conversion Conference Record of September 1979; and "A Review of Switch Mode Converter Technology", by Rudy Severns, Intersil Application Note A035, February 1980.

Of particular importance is the frequency at which a power processor is operated. When the operating frequency is increased, the size of both the inductive elements and the filter capacitors may be reduced, decreasing the size, weight and cost of the power processor. A limitation upon the operating frequency of a power processor is imposed by the switching speed, the turn-on and turn-off rates, of the associated switching circuit. Besides the direct limitation, a practical limitation upon the operating frequency of a power processor may be imposed by the total power dissipation of the switching circuit, which often is principally the result of power dissipated during the period when the circuit is in transition, turning on or turning off.

One prior-art power pulse switching circuit which exhibits a particularly low level of power dissipation and a fast switching rate includes a bipolar transistor operated in a commonemitter mode and a saturable core current transformer having a pair of windings. The transistor, which switches current between a pair of terminals, has an emitter connected to a first one of the terminals, a collector coupled to the other terminal by one of the transformer windings and a base coupled to the first terminal by the other transformer winding. The turns ratio of the collector and base windings of the current transformer provide current feedback for the transistor establishing a forced transistor beta at a value which approximates the turns ratio. The circuit additionally includes means for initiating conduction of the transistor in response to the triggering signal and means for resetting the transformer core following each pulse.

Another prior-art power-pulse switching circuit differs from the above-mentioned circuit in that the transistor is operated in a common-collector configuration. The transistor has an emitter coupled to the first terminal by one of the windings, or a portion of a single center tapped winding, a base coupled either to the emitter or the first terminal by the other winding, or the other portion of the center tapped winding, and a collector connected to the other terminal.

The above two prior-art circuits are particularly advantageous in that they employ proportional feedback, the base drive being derived directly from the power flow itself. Thus, for light loads, the base drive is reduced increasing the circuit efficiency. Additionally, the lower base drive produces fewer stored carriers improving the rate at which the circuit turns off.

Unfortunately, the disparity in the number of turns comprising the collector or emitter winding and the base winding of the current transformer employed in these prior-art circuits makes it difficult to wind the transformer so as to have a low value of leakage inductance. The transformer leakage inductance along with the parasitic capacitance of the transformer and the feed-through capacitance of the transistor all tend to degrade the rate with which these circuits turn-on and turn-off. Further it has been found that the optimum turn-on and turn-off rate may be achieved when there is a minimum of resistance in series with the base. Thus, the base winding, by being in series with the base, tends to further degrade the rate with which the transistor turns on and turns off.

Finally, it has been found that the optimal turn-off rate may be achieved when, at turn-off time, all of the collector current is diverted from the emitter to the base to sweep out stored charge. Additional current tends to degrade the turn-off rate in that it comes from emitter-base junction avalanche breakdown which tends to produce additional stored charge. Although, in both of these prior art circuits, a portion of the collector current is diverted to the base at turn-off time, the transformer leakage inductance and parasitic capacitance limits the magnitude of the diverted current preventing an optimal turn-off rate from being achieved.

Limitations of the above-described prior-art power pulse switching circuits are discussed in an article entitled "A New Improved And Simplified Proportional Base Drive Circuit" authored by Rudy Severns and published in the proceedings of the Sixth National Solid-State Power Conversion Conference dated May 1979 beginning on page B2.

Also of interest is the article authored by the application entitled "A High Speed Proportional Feedback Switching Circuit" published in the January/February 1979 issue of "Solid-State Power Conversion" beginning on page 9.

SUMMARY OF THE PRESENT INVENTION

It is therefore an object of the present invention to provide a proportional feedback type power-pulse switching circuit employing a saturable-core current transformer having a near unity turns ratio.

Another object of the present invention is to provide a proportional feedback type power-pulse switching circuit in which a minimum of resistance is in series with the base of a bipolar switching transistor.

Briefly, a preferred embodiment of the present invention includes a transistor having a base connected to a first terminal, an emitter and a collector and a saturable core transformer having an emitter winding directly coupling the emitter to the first terminal and a collector winding coupling a second terminal to the collector. Additionally, the embodiment includes means for causing conduction of the first transistor in response to a triggering signal, such as a second transistor driving a third winding of the transformer through the series combination of a capacitor, an inductor and a resistor, and means for resetting the transformer core following each pulse, such as a current source driving a fourth winding of the transformer.

In another embodiment, a blocking diode is interposed between the emitter of the first transistor and the emitter winding. Additionally, means for providing additional protection for the emitter-base junction of the first transistor, such as a network connected between the emitter and the base of the first transistor, is also included. Typical networks include the parallel combination of a capacitor and a resistor, the parallel combination of a capacitor and the series combination of a plurality of diodes, and the parallel combination of a capacitor, a resistor and the series combination of a blocking and a zener diode.

A material advantage of the present invention is its switching rate.

Another advantage of the present invention is its efficiency.

Still another advantage of the present invention is its simplicity.

These and other objects and advantages of the present invention will no doubt become apparent to those skilled in the art after having read the following detailed description of the preferred embodiments which are illustrated in the several figures of the drawing.

IN THE DRAWING

FIG. 1 is a schematic diagram illustrating a power-pulse switching circuit in accordance with the present invention;

FIG. 2 is a schematic diagram illustrating an alternative embodiment of a power-pulse switching circuit in accordance with the present invention;

FIG. 3A is a schematic diagram illustrating one embodiment of a protective network for use in the power-pulse switching circuit shown in FIG. 2;

FIG. 3B is a schematic diagram illustrating another embodiment of a protective network for use in the power-pulse switching circuit shown in FIG. 2;

FIG. 3C is a schematic diagram illustrating still another embodiment of a protective network for use in the power-pulse switching circuit shown in FIG. 2;

FIG. 4 is a schematic diagram illustrating a DC-to-DC converter employing a symmetrical power-pulse switching circuit in accordance with the present invention;

FIG. 5 is a schematic diagram illustrating a DC-to-AC inverter employing a dual power-pulse switching circuit in accordance with the present invention;

FIG. 6 is a schematic diagram illustrating a bucking regulator employing a power-pulse switching circuit in accordance with the present invention; and FIG. 7 is a schematic diagram illustrating a boost regulator employing a power-pulse switching circuit in accordance with the present invention.

DETAILED DESCRIPTION OF THE PREFERRED EMBODIMENTS

In accordance with the present invention, a preferred embodiment of a proportional feedback type power-pulse switching circuit is illustrated in FIG. 1 generally designated by the number 10. Circuit 10 is shown to include a saturable-core current transformer 12 having an emitter winding 14 and a collector winding 16 and a transistor 18 having an emitter, a base and a collector. One end of winding 14 is connected by a line 20 to a terminal 22. The other end of winding 14 is connected to a node 24, which is connected to the emitter of transistor 18. The base of transistor 18 is connected to terminal 22 by a line 26. Winding 16 has one end connected by a line 28 to a terminal 30, the other end of winding 16 being connected by a line 32 to the collector of transistor 18. In this embodiment, node 24 is connected by a line 34 to a terminal 36.

The ratio of the turns of windings 14 and 16 establishes a forced beta for transistor 18. In other words, if winding 14 has four turns and winding 16 has five turns, transistor 18 is operated with a forced beta of four. Note, since the two windings have almost the same number of turns, it is relatively easy, and preferable, to wind windings 14 and 16 of transformer 12 so as to minimize transformer leakage inductance, as for example, by winding the windings upon the core in bifilar fashion. When bifilar wound, the windings are wound one between the other such that the windings are interleaved.

Circuit 10 additionally includes means for initiating conduction of transistor 18 in response to a triggering signal and means for resetting the transformer core following each pulse. In this embodiment, a triggering signal of suitable shape and amplitude is AC-coupled to terminal 36 so as to directly drive the emitter of transistor 18.

A current source for driving winding 14 and resetting the transformer core is developed, such as by a resistor connected between a suitable potential and terminal 36, the current source imposing minimal loading of the regenerative signals when the transistor is on.

Operationally, each power pulse is initiated by the triggering signal which forward biases transistor 18. Thereafter, regenerative feedback rapidly drives transistor 18 into saturation. Since the base drive is derived directly from the power conducted between terminals 22 and 30, good efficiency is maintained even when a relatively small current is conducted between terminals 22 and 30, light loading. The turn-on rate is particularly high not only because of the proportional feedback, but because transformer 12, when bifilar wound, has minimum leakage inductance. Further minimum resistance is in series with the base of transistor 18 and, because of the common base configuration, the transistor presents a minimum amount of feed-through capacitance.

When the core of transformer 12 saturates, decoupling windings 14 and 16 of transformer 12, transistor 18 turns off. Because of the low leakage inductance of transformer 18, essentially all of the collector current is diverted from the emitter to the base rapidly sweeping out the stored carriers to rapidly turn off the transistor.

Finally, the resetting current flowing from terminal 36 through winding 14 resets the core of transformer 12. It should be noted that the resetting current subtracts from the drive current thereby limiting the minimum load range. Should additional range be desired, the resetting current should be pulsed.

Since the resetting of the transformer core generates a potential that reverse biases the emitter-base junction of transistor 18, the breakdown potential of the transistor emitter-base junction limits the duty cycle of this embodiment. Additionally, the current diverted during turn-off also reverse biases the emitter-base junction of the transistor. Thus, in this embodiment, it is important to insure that the potential developed across the transistor junction does not damage the transistor.

Illustrated in FIG. 2 is another embodiment of a proportional feedback type power-pulse switching circuit in accordance with the present invention. The circuit, which is generally designated by the number 50, includes a saturable-core transformer 52, a transistor 54, a blocking diode 56 and an emitter-base junction protective network 58. Transformer 52 has a collector winding 60 coupling the collector of transistor 54 to a terminal 62 and an emitter winding 64 connected between a terminal 66 and diode 56, the distal end of which is connected by a line 67 to the emitter of transistor 54. The base of transistor 54 is connected to terminal 66 by a line 69 and coupled to the emitter of transistor 54 by network 58.

Transformer 52 also has a winding 68 driven by a triggering circuit 70 and a winding 72 driven by a resetting circuit 74. Triggering circuit 70 includes a transistor 80 having a base connected to a terminal 82 for receiving a triggering signal, a grounded emitter and a collector connected to a source of potential by a load resistor 84. Also included is a pulse-forming network comprised of a capacitor 86, an inductor 88 and a resistor 90 series connected between the collector of transistor 80 and one end of winding 68, the distal end of which is connected to circuit ground.

It has been found that for best triggering the values of the components of the pulse-forming network, capacitor 86, inductor 88 and resistor 90, should be chosen such that when discharged, the network drives transformer 54 with a slightly over-damped sinusoidal signal. To insure proper latching of the circuit, the signal should have a width of approximately one percent of the power pulse width and an amplitude approximately equal to the operating base current of transistor 54.

For example, if six turns are employed for winding 60 and five turns for winding 64, transistor 54 will operate with a forced beta of five. In this case, should ten turns be employed for winding 68, only a one-half ampere peak signal need be developed by circuit 70 in order to drive the emitter of transistor 54 with a one ampere peak signal in response to a triggering signal developed at terminal 82. To develop such a signal, the impedance of the pulse forming network should be approximately 20 ohms, when transistor 80 is operated with a 12 volt supply potential. Capacitor 86, inductor 88 and resistor 90 should have roughly similar impedances at a frequency chosen to produce the desired width pulse. For a frequency of 2 megahertz, component values of 0.02 microfarads for capacitor 86, 300 nanohenrys for inductor 88 and 4 ohms for resistor 90 would be typical.

Reset circuit 74 includes a transistor 100 having an emitter coupled to a source of potential by a biasing resistor 102, a base coupled to circuit ground by a biasing resistor 104 and to the potential source by a zener diode 106 and a collector. An inductor 108 is connected between the collector of transistor 100 and one end of winding 72, the distal end of which is grounded. Further, a decoupling capacitor 110 is connected between the collector of transistor 100 and circuit ground, and a series combination of a zener-clamping diode 112 and a blocking diode 114 are connected across winding 72.

Transistor 100, resistors 102 and 104 and diode 106 operate as a constant-current source for developing a current for driving winding 72 to reset the core of transformer 52. When the core is being reset, a substantial reset potential in the form of a reset pulse is developed across windings 64 and 72 when the power-pulse switching circuit is operated at a relatively-high-duty cycle. Clamping diode 112 limits the magnitude of the reset voltage pulse to the desired level, and inductor 108 attempts to maintain a constant current flow through winding 72 during the period of the pulse. Finally, capacitor 110 isolates the pulse from the collector of transistor 100.

For the above example, assuming a potential of 2 volts, the potential drop of the emitter-base junction of transistor 54 and that of diode 56, is impressed across winding 64 when transistor 54 is on, and assuming a duty cycle of ninety percent, then a potential of twenty volts must be developed across winding 64 to reset the core. If ten turns are employed for winding 72, then forty volts need be developed across this winding. In this case, diode 112 should have a zener potential of approximately 39 volts. An inductance for inductor 108 which permits approximately 10-20 percent droop in the reset current, 10-20 milliamps for a reset current of 100 milliamps, would be typical.

Protection of the emitter-base junction of transistor 54 is provided by diode 56 and protective network 58. Diode 56 isolates most of the energy of the reset pulse developed across winding 64 from transistor 54. Any portion of the energy of the reset pulse which is coupled to the transistor by the junction capacitance and leakage resistance of diode 56 and which may exceed the ratings of transistor 54 is shunted by network 58. Additionally, network 58 limits the level of the potential that is developed across the emitter-base junction of transistor 54 when the transistor is turning off. However, since conduction by network 58 tends to degradate the turn-off rate of transistor 54, the components comprising the network should be optimized for the particular operating characteristics.

Illustrated in FIG. 3A is an embodiment of a protective network for use in the power-pulse switching network shown in FIG. 2. Network 58A includes a capacitor 120 and a resistor 122 each of which is connected between line 67A and 69A.

Capacitor 120 protects the emitter-base junction of transistor 56, shown in FIG. 2, from the high frequency components of the transformer-core-resetting pulse by forming a capacitive-voltage divider with the junction capacitance of blocking diode 56, also shown in FIG. 2. Additionally, capacitance 120 bypasses high-frequency noise, such as ringing which may result from the leakage inductance and parasitic capacitance of transformer 52. Such ringing may be particularly detrimental if unbypassed and if it occurs during the time the transistor is turning off as it may tend to turn the transistor back on. Oftentimes, the transistor emitter-base capacitance is sufficient to render capacitor 120 unnecessary.

Resistor 122 forms a voltage divider with the leakage resistance of the blocking diode. The resistor also limits the potential developed across the transistor emitter-base junction when the transistor is turning off. The use of a resistor, such as resistor 122, is particularly advantageous because of its low cost.

An alternative embodiment of a protective network for use in the power-pulse switching circuit illustrated in FIG. 2 is shown in FIG. 3B. In this embodiment, a capacitor 130 and a series combination of a plurality of diodes 134 and 136-138 are connected in parallel between lines 67B and 69B. Diodes 134 and 136-138 function in place of the corresponding resistor of the embodiment illustrated in FIG. 3A. The diodes are advantageous in that they permit the potential developed across the emitter-base junction of transistor 54 to be more precisely controlled.

Another alternative embodiment of a protective network for use in the power-pulse switching circuit illustrated in FIG. 2 is shown in FIG. 3C. In addition to a capacitor 140 and a resistor 142, each connected between line 67C and 69C, this embodiment includes a series combination of a blocking diode 145 and a zener diode 147 connected in series between lines 67C and 69C. Zener diode 147 is advantageous in that it establishes a maximum potential that is relatively temperature independent.

Turning to FIG. 4, a DC-to-DC converter 200 is illustrated employing a symmetrical power-pulse switching circuit 201 in accordance with the present invention. Converter 200 includes a pair of transistors 202 and 204, a saturable-core current transformer 206 having four windings 208, 210, 212 and 214 and a transformer 220 having a center-tapped primary winding 222 and a secondary winding 224. Transistor 202 has an emitter coupled to circuit ground by winding 208, a grounded base and a collector coupled to one end of winding 222 by winding 210. Transistor 204 is similarly connected having an emitter coupled to circuit ground by winding 212, a grounded base and a collector coupled to the other end of winding 222 by winding 214. A source of potential is connected to the center tap of winding 222. Winding 224 is coupled by a rectifier 228 to the parallel combination of a filter capacitor 230 and a load 232.

Depending upon the magnitude of the leakage inductance and parasitic capacitance of transformer 206, a pair of capacitors may be required each being connected across the emitter-base junction of a corresponding transistor each to bypass currents induced from the collector winding of the opposing transistor.

The circuit parasitics are operative to couple energy from one transistor as it turns off to the other transistor turning it on, providing a natural commutation alternatively initiating the conduction of transistors 202 and 204. The conduction of each of transistors 202 and 204 is operative to reset the core of the other transistor. In addition, the emitter-base diode voltage drop of the conducting transistor clamps the potential protecting the emitter-base junction of the other transistor. In an alternative embodiment, a fifth winding on transformer 206 and bipolar triggering circuit driving the fifth winding are employed to alternately initiate the conduction of transistors 202 and 204.

Illustrated in FIG. 5 is a half-bridge inverter 300 employing a dual power-pulse switching circuit in accordance with the present invention. Inverter 300 includes a pair of filter capacitors 302 and 304, a transformer 306 and a dual power-pulse switching circuit 307. Filter capacitors 302 and 304 are connected in series between a potential source and circuit ground to form a voltage divider developing a reduced potential at a node 308 at the juncture of the capacitors. Transformer 306 has a primary winding 310 connected between node 308 and a node 312 and a secondary winding 314 across which a load 316 is connected.

Dual power-pulse switching circuit 307 includes a pair of transistors 320 and 322, a saturable-core current transformer 324 and a bipolar triggering circuit 326. Transformer 324 has five windings including a winding 330 coupling the collector of transistor 320 to the power supply potential and a winding 332 coupling the emitter of transistor 320 to node 312. Additionally included is a winding 334 coupling node 312 to the collector of transistor 322 and a winding 336 coupling the emitter of transistor 322 to circuit ground. The fifth winding of transformer 324, a winding 338, is connected to the bipolar triggering circuit 326 so as to be driven thereby.

The base of transistor 320 is connected to node 312, and the base of transistor 322 is grounded.

Operationally, bipolar triggering circuit 326 alternately initiates conduction of transistors 320 and 322 which develop at node 312 an AC potential suitable for powering load 316 after being transformed by transformer 306.

A bucking regulator employing a power-pulse switching circuit in accordance with the present invention is illustrated in FIG. 6. The regulator, designated 400, includes the power-pulse switching circuit, designated 402, connected between a source of potential and a node 404, a load-line-correcting circuit 406 including a circulating diode, circuit 406 being connected between node 402 and circuit ground, an inductor 408 connected between node 402 and a node 410, a filter capacitor 412 which with a load 412 is connected in parallel between node 410 and circuit ground.

Additionally, a comparator 416 which functions as an error amplifier, comparator 416 having one input connected to node 410 and another input connected to a reference source 418 has an output which drives power-pulse switching circuit 402.

Power-pulse switching circuit 402 includes a transistor 430, a protective network 432, a blocking diode 434, a saturable-core current transformer 436, a resetting circuit 438 and a triggering circuit 439. Transformer 436 has a winding 440 coupling the collector of transistor 430 to the potential source and a winding 442 coupling node 404 to one end of diode 434 the distal end of which is connected to the emitter of transistor 430. Transformer 436 further has a winding 444 connected to resetting circuit 438 and a winding 446 connected to triggering circuit 439 which is driven by comparator 416. Protective network 432 is connected between the emitter and the base of transistor 430 which is also connected to node 404.

A boost regulator 500 is illustrated in FIG. 7 employing a power-pulse switching circuit 502 in accordance with the present invention. Regulator 500 includes an inductor 504 coupling a source of potential to a node 506, a blocking diode 508 coupling node 506 to a node 510 and a capacitor 512 which with a load 514 are connected in parallel between node 510 and circuit ground. A comparator 520 has an input connected to a reference source 522, an input connected to node 510 and an output which drives power-pulse switching circuit 502.

Power-pulse switching circuit 502 includes a transistor 530 having a base connected to circuit ground, a protective network 532 connected across the emitter-base junction of transistor 530, a blocking diode 534 and a saturable-core current transformer 536. Transformer 536 has a winding 540 coupling node 506 to the collector of transistor 530, a winding 542 connected between circuit ground and one end of diode 534 the distal end of which is connected to the emitter of transistor 530, a winding 544 and a winding 546. Power-pulse switching circuit 502 additionally includes a triggering circuit 548 connected to winding 544 and comparator 520 and a resetting circuit 550 connected to winding 546.

Although it is contemplated that after having read the preceding disclosure certain alterations and modifications of the present invention will no doubt become apparent to those skilled in the art, it is intended that the following claims be interpreted to cover all such alterations and modifications as fall within the true spirit and scope of the invention.

What is claimed is:

1. A power-pulse switching circuit for conducting a pulse of current between a first and a second terminal in response to a triggering signal, said switching circuit comprising in combination:
   coupling means;
   a transistor including a base connected to the first terminal, an emitter and a collector;
   a transformer including a collector winding having a first plurality of turns coupling said collector to the second terminal, an emitter winding having a second plurality of turns delineated by a first end connected to said first terminal and a second end coupled to said emitter by said coupling means and a saturable core coupling said collector winding to said emitter winding, said first plurality of turns being greater than said second plurality of turns whereby regenerative current feedback is provided from said collector to said emitter; and
   triggering means for initiating conduction of said transistor in response to said triggering signal whereby regenerative action of said transistor and said transformer cause saturation of said transistor until such time as saturation of said core occurs.

2. A power-pulse switching circuit as recited in claim 1 further comprising means for resetting said core.

3. A power-pulse switching circuit as recited in claim 2 wherein said resetting means includes a reset winding wound upon said core and means for inducing a current to flow through said third winding.

4. A power-pulse switching circuit as recited in claim 3 wherein said inducing means includes a current source, an inductor coupling said current source to said reset winding whereby a current is induced to flow therethrough, a blocking diode and a zener diode connected in series with said blocking diode across said reset winding so as to limit the potential developed thereacross when said core is reset.

5. A power-pulse switching circuit as recited in claim 2 wherein said triggering means includes a triggering winding coupled to said emitter winding by said core and means for inducing a current flow through said triggering winding in response to said triggering signal.

6. A power-pulse switching circuit as recited in claim 5 wherein said inducing means includes a pulse-forming network having a capacitor, an inductor and a resistor connected in series with said capacitor, said inductor and said triggering winding, means for storing energy in said pulse-forming network and means responsive to said triggering signal for discharging through said triggering winding energy stored in said pulse-forming network.

7. A power-pulse switching circuit as recited in claim 2 further comprising protective means connected between said emitter and said base, said protective means for limiting the potential developed thereacross.

8. A power-pulse switching circuit as recited in claim 7 wherein said protective means includes a capacitor connected between said emitter and said base.

9. A power-pulse switching circuit as recited in claim 7 wherein said coupling means includes a blocking diode connected between said emitter and said second end of said emitter winding, said diode for blocking signals developed across said emitter winding when said core is reset.

10. A power-pulse switching circuit as recited in claim 9 wherein said protective means includes a capacitor connected between said emitter and said base.

11. A power-pulse switching circuit as recited in claim 9 wherein said protective means includes a resistor connected between said emitter and said base.

12. A power-pulse switching circuit as recited in claim 9 wherein said protective means includes a plurality of series connected diodes connected between said emitter and said base.

13. A power-pulse switching circuit as recited in claim 9 wherein said protective means includes a blocking diode and a zener diode connected in series with said blocking diode between said emitter and said base.

14. In a power processor including a power-pulse switching circuit for developing a series of current pulses from a source of potential and an inductive element for developing a load-powering potential from the series of current pulses, an improved power-pulse switching circuit comprising in combination:
a first terminal;
a second terminal;
coupling means;
a transistor including a base connected to said first terminal, an emitter and a collector;
a transformer including a collector winding having a first plurality of turns coupling said collector to said second terminal, an emitter winding having a second plurality of turns delineated by a first end connected to said first terminal and a second end coupled to said emitter by said coupling means and a saturable core coupling said collector winding to said emitter winding, said first plurality of turns being greater than said second plurality of turns whereby regenerative current feedback is provided from said collector to said emitter; and
triggering means for initiating conduction of said transistor in response to said triggering signal whereby regenerative action of said transistor and said transformer cause saturation of said transistor until such time as saturation of said core occurs.

15. In a power processor as recited in claim 14 further comprising means for resetting said core.

16. In a power processor as recited in claim 15 wherein said resetting means includes a reset winding wound upon said core and means for inducing a current to flow through said third winding.

17. In a power processor as recited in claim 14 wherein said triggering means includes a triggering winding coupled to said emitter winding by said core and means for inducing a current flow through said triggering winding in response to said triggering signal.

18. In a power processor as recited in claim 17 wherein said inducing means includes a pulse-forming network having a capacitor, an inductor and a resistor connected in series with said capacitor, said inductor and said triggering winding, means for storing energy in said pulse-forming network and means responsive to said triggering signal for discharging through said triggering winding energy stored in said pulse forming network.

19. In a power processor as recited in claim 14 further comprising protective means connected between said emitter and said base, said protective means for limiting the potential developed thereacross.

20. A power processor as recited in claim 14 wherein said coupling means includes a blocking diode connected between said emitter and said second end of said emitter winding, said diode for blocking signals developed across said emitter winding when said core is reset.

21. A power-pulse switching circuit responsive to a triggering signal and operative to conduct a pulse of current between a first and a second terminal between which an externally generated potential is developed, said switching circuit comprising in combination:
coupling means;
a transformer including a collector winding having a first plurality of turns, an emitter winding having a second plurality of turns and a saturable core coupling said collector winding to said emitter winding, said first plurality of turns being greater than said second plurality of turns;
a transistor including a base, an emitter and a collector, said transistor being connected in a common emitter configuration in which said base is connected to said first terminal, said emitter is coupled by the series combination of said coupling means and said emitter winding to said first terminal and said collector is coupled to said second terminal by said collector winding; and
triggering means for initiating conduction of said transistor in response to said triggering signal whereby regenerative action of said transistor and said transformer cause saturation of said transistor until such time as saturation of said core occurs.

* * * * *